United States Patent [19]

Stewart

[11] 4,015,145
[45] Mar. 29, 1977

[54] VOLTAGE COMPENSATED TIMING CIRCUIT

[75] Inventor: John W. Stewart, Wichita, Kans.

[73] Assignee: NCR Corporation, Dayton, Ohio

[22] Filed: Sept. 19, 1975

[21] Appl. No.: 614,808

[52] U.S. Cl. .............................. 307/293; 307/265; 307/247 A; 307/273; 328/58; 328/207

[51] Int. Cl.² ...................... H03K 5/13; H03K 1/12

[58] Field of Search ...... 307/265, 273, 293, 247 A; 328/58, 207

[56] References Cited

UNITED STATES PATENTS

| | | | |
|---|---|---|---|
| 3,277,319 | 10/1966 | Stevens, Jr. | 307/265 |
| 3,378,701 | 4/1968 | Frank | 307/265 |
| 3,456,130 | 7/1969 | Bailey | 307/235 T |
| 3,484,624 | 12/1969 | Rasiel et al. | 307/265 |
| 3,532,993 | 10/1970 | Kennedy | 307/265 |
| 3,582,687 | 6/1971 | Bellomo | 307/273 |
| 3,742,257 | 6/1973 | Wittenzellner | 307/265 |
| 3,746,892 | 7/1973 | Ogiso et al. | 307/297 |
| 3,883,756 | 5/1975 | Dragon | 307/273 |
| 3,904,894 | 9/1975 | Ciolli | 307/273 |

*Primary Examiner*—Stanley D. Miller, Jr.
*Attorney, Agent, or Firm*—J. T. Cavender; Albert L. Sessler, Jr.

[57] ABSTRACT

A circuit provides means for controlling the energy derived from operation of a load by delivering a timed output pulse which is a function of the applied circuit voltage. Operation of a variable charging means, coupled across the applied circuit voltage, is initiated by application of an input signal to the circuit and charges at a rate dependent upon the applied circuit voltage. A differential amplifier, responsive to the condition of the charging means, controls a driver which operates a latch to determine the duration of the output pulse.

1 Claim, 2 Drawing Figures

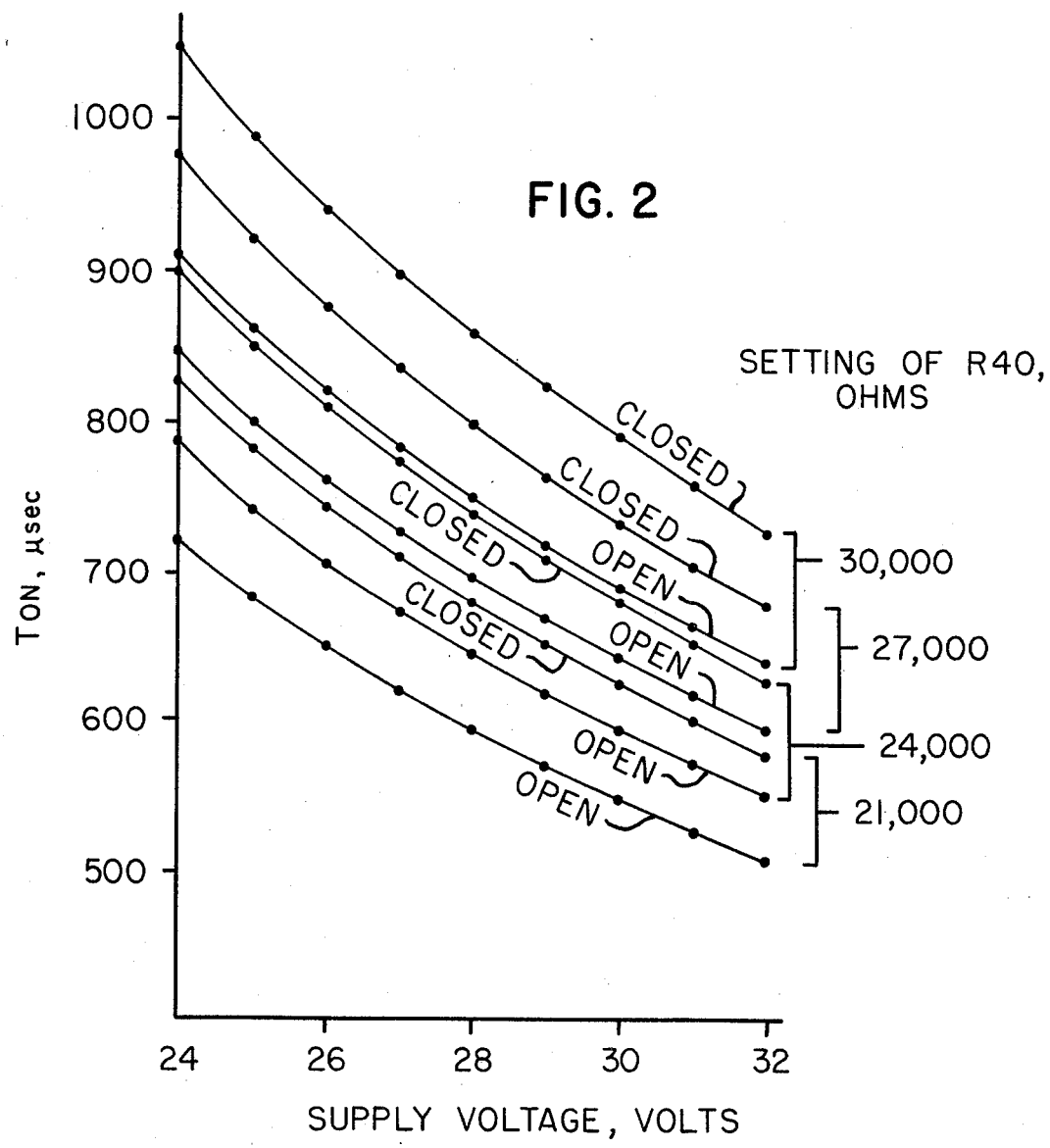

VOLTAGE COMPENSATED TIMING CIRCUIT

BACKGROUND OF THE INVENTION

In the field of high-speed printing devices which are especially suitable for use in connection with electronic business systems, the wire matrix type of printer has come into increasing use. In this type of printer, letters, numbers and symbols are formed from a series of dots produced by the impact of the ends of a plurality of wire elements on record media, most customarily in combination with an ink ribbon which provides the ink needed to produce a mark on the record medium being printed upon.

Customarily each of the individual wire printing elements of a wire matrix printer is driven by a solenoid which is energized when a printing stroke of that wire is required. Since all of the solenoids are normally coupled to a single power supply, and since the number of solenoids driven to produce a print for a particular character or portion of a character may differ substantially from one time to the next, it will be understood that some variation in the voltages applied to the solenoids from the power supply may result. If not corrected in some way, this variation of voltage is likely to result in variation of the energy applied to the wire elements by energization of the solenoids, with the consequence of a non-uniform appearance in the printing on the record medium.

SUMMARY OF THE INVENTION

The purpose of the present invention is to provide means for maintaining the energy derived from a solenoid actuation nearly constant when the voltage applied to the solenoid is varied. Broadly speaking, this is accomplished by controlling the duration of time that the circuit applies power to the solenoid.

According to the invention, an electrical circuit comprises a multi-state device having first and second inputs and at least one output, with said output constituting the output for the circuit; input means for applying an input signal to a first one of said inputs of said multi-state device; first and second signal translating devices having a corresponding first electrode of each coupled together and to a reference potential over an impedance, and having a corresponding second electrode of each coupled over an impedance to a source of potential; a third signal translating device having a first electrode coupled to a reference potential, a second electrode coupled to a control electrode of said first signal translating device, and a control electrode coupled to the output of said multi-state device; variable charging means coupled to the control electrode of said first signal translating device, to a source of circuit potential, and to said reference potential; fixed biasing means coupled to a control electrode of said second signal translating device to provide a fixed bias thereto; a fourth signal translating device having a first electrode coupled to a source of potential, a second electrode coupled to a second input of said multi-state device, and a control electrode coupled to the second electrode of the second signal translating device; and time delay means included in the path coupling the output of the multi-state device to the control electrode of the third signal translating device; whereby said multi-state device is caused to assume a first state by application of an input signal to said first input thereof, and is caused to assume a second state by application of a signal to said second input thereof, thereby controlling the pulse width of the output signal of said multi-state device in accordance with the magnitude of the voltage of said source of circuit potential.

One advantage of the present invention is that the energy output of a solenoid or other load is relatively insensitive to supply voltage variations.

Another advantage is that a single voltage sensing means may be used to control a number of identical solenoids or other loads.

A third advantage is that pulse width control of energy applied to solenoids or other loads makes the use of saturated switching drivers feasible, thus reducing power dissipation and circuit complexity of the driver.

An additional advantage is that different circuit energy levels can easily be selected by controlling timing circuit parameters, and time constants and scale factors can be adjusted to compensate for non-linearities of the system.

Finally, good thermal stability of the circuit is achieved by use of a differential amplifier configuration for the voltage sensing means.

It is thereof an object of the invention to provide an improved solenoid operating circuit.

An additional object is to provide an operating circuit capable of accurately controlling the energy derived from a solenoid actuation.

An additional object is to provide means for operating a saturating driver in which the control variable is the duration of the drive time.

Another object is to provide a circuit which provides a timed output pulse that is a function of the applied circuit voltage.

With these and other objects, which will become apparent from the following description, in view, the invention includes certain novel features of construction and combinations of parts, one form or embodiment of which is hereinafter described with reference to the drawing which accompanies and forms a part of this specification.

BRIEF DESCRIPTION OF THE DRAWINGS

FIG. 2 shows a series of wave forms illustrating the relationship between output pulse duration and supply voltage in the circuit of FIG. 1 utilizing various component adjustments.

DESCRIPTION OF THE PREFERRED EMBODIMENT

Figure 1:
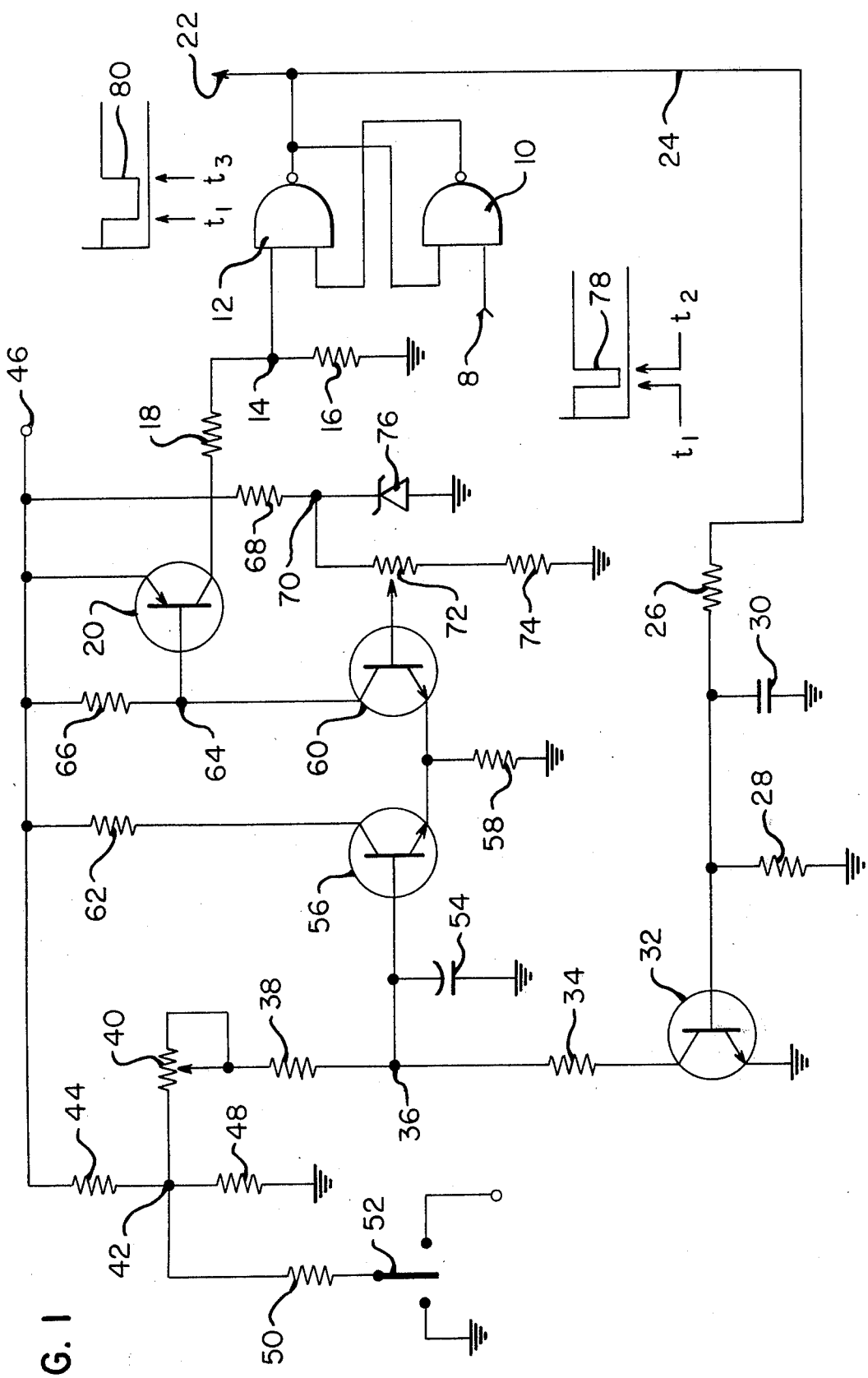
FIG. 1 is a schematic diagram of a circuit embodying the invention.

Referring now to the illustrated embodiment shown in FIG. 1, an input signal having a duration $t_2-t_1$ is applied to one input 8 of a NAND gate 10, the output of which is applied to one input of a second NAND gate 12, the two NAND gates 10, 12 together forming a latch. The remaining input of the NAND gate 12 is connected to a circuit node 14. One circuit branch extends from the node 14 through a resistor 16 to a base reference potential, shown here as ground, while a second branch extends through a resistor 18 to the collector of a PNP-type transistor 20.

The output of the NAND gate 12 is connected to a second input of the first NAND gate 10, as well as being connected to an output terminal 22, and to a conductor 24, which in turn is connected to one end of a resistor 26. At its other end, the resistor 26 is connected through parallel combination of a resistor 28 and a capacitor 30 to a base reference potential, shown as ground, as well as to the base electrode of an NPN-type transistor 32, having its emitter connected to said base reference potential.

The collector of the transistor 32 is connected through a resistor 34, a node 36, a resistor 38, a variable resistor 40, a node 42 and a resistor 44 to a source 46 of supply potential. From the node 42, a first path extends through a resistor 48 to base reference potential or ground, and a second path extends through a resistor 50 to a switch 52, one side of which is connected to base reference potential or ground, and the other side of which is open.

From the node 36, a first path extends through a capacitor 54 to base reference potential, or ground, and a second path extends to the base of an NPN transistor 56, having its emitter connected over a resistor 58 to base reference potential, or ground, and also being coupled to the emitter of an NPN transistor 60. The collector of the transistor 56 is connected through a resistor 62 to the source 46 of supply potential. Similarly, the collector of the transistor 60 is connected through a node 64 and a resistor 66 to the source 46. The base of the transistor 60 is biased to a reference voltage of 4.6 volts by a voltage divider path extending from the source 46 through a resistor 68, a node 70, a variable resistor 72 connected to the base of the transistor 60, and a resistor 74, to base reference potential, or ground. The node 70 is connected through a 5.6 voltage zener diode 76 to base reference potential, or ground.

The emitter-coupled transistors 56 and 60 function as a differential amplifier for comparing the capacitor voltage of capacitor 54 applied to the base of the transistor 56 with the bias voltage applied to the base of the transistor 60. Connection of the base of the driver transistor 20 to the node 64 in the collector circuit of transistor 60 provides control of said driver transistor with the condition of the capacitor 54.

In operation, a low-going input signal, such as the signal 78 shown in FIG. 1, typically having a duration of two microseconds, is applied to the input 8 of the NAND gate 10. This sets the NAND gate latch 10, 12, causing the output signal, such as the signal 80 shown in FIG. 1, to go low, and causes the timing circuit of FIG. 1 to commence operation.

The output signal 80, shown in FIG. 1 as having a duration of 700 microseconds, indicated as the difference between $t_3$ and $t_1$, normally will be applied through additional circuitry (not shown) to energize a matrix print wire solenoid, although it is obviously also susceptible of other uses.

When the pulse 80 goes low as a result of the input pulse 78, this signal is applied over the conductor 24 and a time delay network comprising the resistors 26, 28 and the capacitor 30 to the base of the transistor 32, turning off said transistor. The time delay caused by the time delay network during this phase of circuit operation is insignificant.

Termination of conduction of the transistor 32 causes the capacitor 54 to be charged by the resistive network which includes resistors 38, 40, 44 and 48, as well as resistor 50 when the switch 52 is positioned appropriately. After a time period which is dependent upon the voltage at the source 46 and the resistance values of the resistive network previously mentioned, the voltage on the capacitor 54 reaches the reference voltage placed on the base of the transistor 60, the transistor 56 begins to conduct, and captures the emitter current from the transistor 60, causing it to be turned off.

Since the base current for the transistor 20 is supplied through the transistor 60, its turning off causes the transistor 20 also to be turned off, from its saturated state of conduction. This allows the resistor 16 to pull down the input of the NAND gate 12 of the latch, which forces the output voltage high (as at time $t_3$) and resets the latch, terminating the output pulse 80. The transition to the higher level of the output signal is transmitted through the conductor 24, and the time delay network comprising the resistors 26, 28 and the capacitor 30, to the base of the transistor 32. After a time delay of approximately 2.5 microseconds, the transistor 32 is turned on, which causes the discharge of the capacitor 54 through the resistor 34. The time delay is provided to assure that the capacitor 54 can charge to a potential slightly beyond the actual turn-on threshold of the transistor 56, which provides more than the minimum base current required for conduction to the base of the transistor 56 and assures the turning off of the transistor 60. Also this time delay assures that the latch has ample time to reset.

In the illustrated embodiment, the discharge of the capacitor 30 is 99% accomplished in 25 milliseconds. The transistor 56 turns off, the transistors 60 and 20 turn on, with transistor 20 going to a saturated condition, and the circuit is now ready for another input pulse 78.

Movement of the switch 52 from one contact to the other changes the time required to charge the capacitor 54. In this manner, the output energy of the solenoid operated by the output pulse 80 can be set at two different levels.

With the switch 52 open, and a reference voltage at the base of the transistor 60 of 4.6 volts, the output pulse has a duration $T_{on}$ given by the expression:

$$T_{on} = -RC \ln \left[ \frac{4.6 - \frac{V(R48)}{R44 + R48}}{.1 - \frac{V(R48)}{R44 + R48}} \right]$$

$$\text{When } RC = C54 \left[ \frac{(R44)(R48)}{R44 + R48} + R40 + R38 \right]$$

in which V equals the circuit supply voltage at source 46 and the terms "R" and "C" followed by numbers represent the resistance and capacitance values of the respective resistors and capacitor bearing corresponding reference characters in FIG. 1.

With the switch 52 closed, and a reference voltage at the base of the transistor 60 of 4.6 volts, the output pulse 80 has a duration $T_{on}$ given by the expression:

$$T_{on} = -RC \ln \left[ \frac{4.6 - \frac{V(R48)(R50)}{(R48)(R50) + (R44)(R48) + (R44)(R50)}}{.1 - \frac{V(R48)(R50)}{(R48)(R50) + (R44)(R48) + (R44)(R50)}} \right]$$

$$\text{when } RC = \left[ \frac{(R44)(R48)(R50)}{(R44)(R48)+(R44)(R50)+(R48)(R50)} + R40 + R38 \right] C54$$

in which V equals the circuit supply voltage at source 46 and the terms "R" and "C" followed by numbers represent the resistance and capacitance values of the respective resistors and capacitor bearing corresponding reference characters in FIG. 1.

FIG. 2 shows the relationship between supply voltage and output pulse duration in the illustrated embodiment for various settings of the adjustable resistor 40, with switch 52 in both positions for each value of resistor 40. The versatility of the present circuit is thus clearly demonstrated.

Presented below are component values for the various circuit components included in the illustrated embodiment of FIG. 1. It will, of course, be recognized that these values are merely exemplary, and that the selection of other component values to achieve desired circuit parameters would be well within the ability of one skilled in the art.

| Ref. Char. | | Value | Ref. Char. | | Value |
|---|---|---|---|---|---|
| 10 | No. | 7400 TTL gate | 48 | | 3000 ohms |
| 12 | No. | 7400 TTL gate | 50 | | 12000 ohms |
| 16 | | 300 ohms | 54 | | 0.047 microfarads |
| 18 | | 2700 ohms | 56 | No. | 2N3904 |
| 20 | No. | 2N3906 | 58 | | 2700 ohms |
| 26 | | 1000 ohms | 60 | No. | 2N3904 |
| 28 | | 470 ohms | 62 | | 5600 ohms |
| 30 | | 0.01 microfarads | 66 | | 4700 ohms |
| 32 | No. | 2N3904 | 68 | | 1800 ohms |
| 34 | | 120 ohms | 72 | | 1000 ohms |
| 38 | | 12000 ohms | 74 | | 1800 ohms |
| 40 | | 50000 ohms | 76 | No. | 1N752A |
| 44 | | 2700 ohms | | | |

Although the invention has been described and illustrates in detail, it is to be clearly understood that the same is by way of illustration and example only, and is not to be taken by way of limitation, the spirit and scope of the invention being limited only by the terms of the appended claims.

What is claimed is:

1. An electrical circuit comprising a multi-state device having first and second inputs and at least one output, with said output constituting the output for the circuit;

input means for applying an input signal to a first one of said inputs of said multi-state device;

first and second signal translating devices having a corresponding first electrode of each coupled together and to a reference potential over an impedance, and having a corresponding second electrode of each coupled over an impedance to a source of potential;

a third signal translating device having a first electrode coupled to a reference potential, a second electrode coupled to a control electrode of said first signal translating device, and a control electrode coupled to the output of said multi-state device;

variable charging means coupled to the control electrode of said first signal translating device, to a source of circuit potential, and to said reference potential;

fixed biasing means coupled to a control electrode of said second signal translating device to provide a fixed bias thereto;

a fourth signal translating device having a first electrode coupled to a source of potential, a second electrode coupled to a second input of said multi-state device, and a control electrode coupled to the second electrode of the second signal translating device; and time delay means included in the path coupling the output of the multi-state device to the control electrode of the third signal translating device;

whereby said multi-state device is caused to assume a first state by application of an input signal to said first input thereof, and is caused to assume a second state by application of a signal to said second input thereof, thereby controlling the pulse width of the output signal of said multi-state device to vary said pulse width in accordance with the magnitude of the voltage of said source of circuit potential.

* * * * *